(12) United States Patent
de Simone et al.

(10) Patent No.: US 7,009,283 B1
(45) Date of Patent: Mar. 7, 2006

(54) NONEXPOSED HEAT SINK FOR SEMICONDUCTOR PACKAGE

(75) Inventors: Christopher J. de Simone, Phoenix, AZ (US); Lucian M. Hand, Bozeman, MT (US); Gi Jeong Kim, Kuri (KR); Seung Mo Kim, Seoul (KR); Jin An Lee, Kuri (KR)

(73) Assignee: Amkor Technology, Inc., Chandler, AZ (US)

( * ) Notice: Subject to any disclaimer, the term of this patent is extended or adjusted under 35 U.S.C. 154(b) by 0 days.

(21) Appl. No.: 09/513,067

(22) Filed: Feb. 24, 2000

(30) Foreign Application Priority Data

Apr. 14, 1999 (KR) ........................ 1999-13130

(51) Int. Cl.
*H01L 23/28* (2006.01)
*H01L 23/495* (2006.01)

(52) U.S. Cl. .................. 257/675; 257/796; 257/666
(58) Field of Classification Search ........... 257/796, 257/666, 670, 690, 695
See application file for complete search history.

(56) References Cited

U.S. PATENT DOCUMENTS

| | | | | |
|---|---|---|---|---|
| 5,140,404 A | * | 8/1992 | Fogal et al. ............... | 257/783 |
| 5,150,193 A | | 9/1992 | Yasuhara et al. ........... | 357/70 |
| 5,233,222 A | | 8/1993 | Djennas et al. ............ | 257/676 |
| 5,327,008 A | * | 7/1994 | Djennas et al. ............ | 257/666 |
| 5,483,098 A | * | 1/1996 | Joiner, Jr. ................ | 257/676 |
| 5,650,663 A | * | 7/1997 | Parthasarathi ............. | 257/706 |
| 5,661,338 A | * | 8/1997 | Yoo et al. ................ | 257/676 |
| 5,723,899 A | | 3/1998 | Shin ...................... | 257/666 |
| 5,780,772 A | | 7/1998 | Singh et al. .............. | 174/52.2 |
| 5,783,860 A | * | 7/1998 | Jeng et al. ............... | 257/675 |
| 5,789,270 A | * | 8/1998 | Jeng et al. ............... | 438/106 |
| 5,798,570 A | * | 8/1998 | Watanabe et al. .......... | 257/796 |
| 5,874,773 A | | 2/1999 | Terada et al. ............. | 257/676 |
| 5,905,299 A | * | 5/1999 | Lacap .................... | 257/666 |
| 5,920,116 A | * | 7/1999 | Umehara et al. .......... | 257/669 |
| 5,923,092 A | * | 7/1999 | Kang ..................... | 257/786 |
| 5,929,513 A | * | 7/1999 | Asano et al. ............. | 257/675 |
| 6,093,960 A | * | 7/2000 | Tao et al. ................ | 257/706 |
| 6,117,709 A | * | 9/2000 | Hirose ................... | 438/121 |
| 6,166,446 A | * | 12/2000 | Masaki ................... | 257/796 |
| 6,201,292 B1 | * | 3/2001 | Yagi et al. ............... | 257/666 |
| 6,208,020 B1 | * | 3/2001 | Minamio et al. .......... | 257/684 |
| 6,215,177 B1 | | 4/2001 | Corisis et al. ............ | 257/666 |
| 6,229,205 B1 | * | 5/2001 | Jeong et al. .............. | 257/676 |
| 6,255,742 B1 | * | 7/2001 | Inaba .................... | 257/796 |
| 6,259,152 B1 | * | 7/2001 | Takeda et al. ............ | 257/666 |
| 6,262,475 B1 | * | 7/2001 | Liu et al. ................ | 257/675 |
| 6,265,760 B1 | * | 7/2001 | Inaba et al. .............. | 257/666 |
| 6,265,762 B1 | * | 7/2001 | Tanaka et al. ............ | 257/676 |
| 6,274,408 B1 | * | 8/2001 | Watanabe et al. ......... | 438/122 |
| 6,306,687 B1 | * | 10/2001 | Corisis et al. ............ | 438/123 |
| 6,335,564 B1 | * | 1/2002 | Pour ..................... | 257/666 |
| 6,340,837 B1 | * | 1/2002 | Miyaki et al. ............ | 257/666 |
| 6,424,023 B1 | | 7/2002 | Kim et al. ............... | 257/666 |

FOREIGN PATENT DOCUMENTS

JP         406232325 A  *  8/1994

* cited by examiner

*Primary Examiner*—Matthew Smith
*Assistant Examiner*—Chuong Luu
(74) *Attorney, Agent, or Firm*—Bever, Hoffman & Harms, LLP; James E. Parsons (57) ABSTRACT

A semiconductor package having a fully encapsulated heat sink is disclosed, along with leadframes for making the package. A semiconductor chip is mounted on a surface of the heat sink. The heat sink is in an electrically insulative, thermally conductive connection with a plurality of leads that extend from a first end that overhangs the heat sink to an second end outside of the package body. A ring of a double sided adhesive tape attaches the heat sink to the overhanging portion of the leads. The heat sink design minimizes voids and damage caused by the encapsulation process, while maintaining thermal performance comparable to conventional, exposed heat sinks.

38 Claims, 10 Drawing Sheets

NONEXPOSED HEAT SINK FOR SEMICONDUCTOR PACKAGE

CROSS-REFERENCE TO RELATED APPLICATION

This application is related to an application entitled "Leadframe for Molded Semiconductor Package and Semiconductor Package Made Using the Leadframe", application Ser. No. 09/513,232, which was filed herewith on Feb. 24, 2000, and is incorporated herein by reference in its entirety.

FIELD OF THE INVENTION

The present invention relates to a semiconductor package, and in particular to a semiconductor package having a nonexposed heat sink.

BACKGROUND OF THE INVENTION

Figure 1:
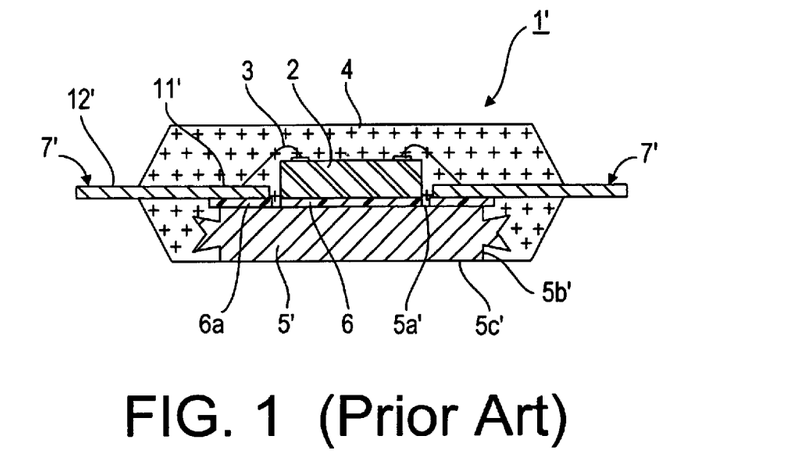
FIG. 1 is a cross-sectional side view of a conventional semiconductor package 1' having a thick, exposed heat sink 5'.

FIG. 1 is a cross-sectional view of a conventional semiconductor package 1'. Package 1' includes a semiconductor chip 2 that is attached to a planar upper surface 5a of a heat sink 5' using adhesive 6. Heat sink 5' has a relatively large thickness (e.g., 1 to 3 mm) and may be formed of copper, aluminum, or other materials. A plurality of metal leads 7' surround semiconductor chip 2. Leads 7' are about 0.12 mm to 0.15 mm thick, and thus are much thinner than heat sink 5'. Each lead 7' comprises an encapsulated inner lead 11' and a nonencapsulated outer lead 12'. The inner leads 11' overlap heat sink 5', but are electrically isolated from heat sink 5' by a dielectric material, e.g., a layer of an adhesive tape 6a. Metal bond wires 3 electrically connect each inner lead 11' to a bond pad of semiconductor chip 2. An insulative, molded resin encapsulate 4 forms the package body and covers semiconductor chip 2, inner leads 11', conductive metal bond wires 3, and upper surface 5a' and side surfaces 5b' of heat sink 5'. Planar lower surface 5c' of heat sink 5' is exposed at the lower surface of the resin encapsulate 4 in order to obtain improved heat discharge characteristics.

Figure 2:
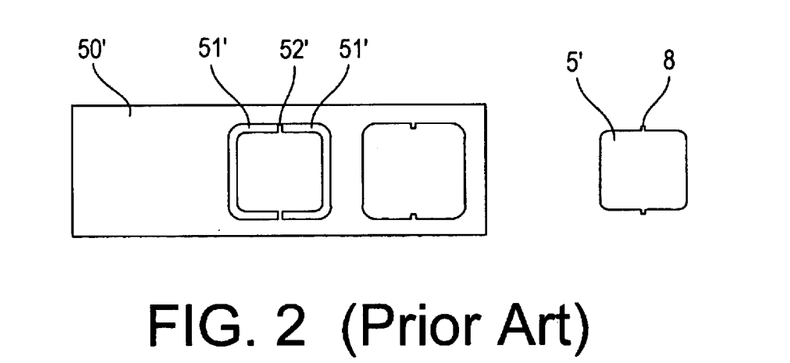
FIG. 2 is a plan view illustrating a procedure for fabricating a conventional heat sink 5' from a metal sheet 50'.

FIG. 2 illustrates a conventional procedure for fabricating a conventional heat sink 5'. In particular, a pair of facing U-shaped slots 51' are stamped through a metal sheet 50'. A pair of opposing support bars 52' remain after slots 51' are stamped. Subsequently, support bars 52' are cut in a second stamping step. Since the support bars 52' are relatively thick, some elongation of support bars 52' occurs during the cutting operation. As a result, V-shaped protrusions 8 are formed on two opposing sides of heat sink 5'. This two step stamping process is used because of the substantial thickness of metal sheet 50' and support bars 52'. If a single stamping step were used instead, heat sink 5' would be bent. Consequently, an additional step to flatten heat sink 5' would be required.

After heat sink 5' is cut from metal sheet 50', heat sink 5' typically is subjected to several complicated coating and treatment steps. For example, the exposed lower surface 5c' of heat sink 5' (FIG. 1) typically is sand blasted to facilitate marking and then plated with nickel. The encapsulated surfaces of a copper heat sink 5' are subjected to a well-known black oxidation process (adapted to form a CuO thin film and/or a $Cu_2O$ thin film) that facilitates the attachment of encapsulate 4 to heat sink 5'.

Conventional heat sink 5' of package 1' and the methods used to make heat sink 5' have several disadvantages. First, as described above, heat sink 5' is too thick to be stamped out in a single stamping step, but rather requires two stamping steps. Second, because lower surface 5c' of heat sink 5' is exposed at the lower surface of the package body, the complicated nickel coating and sand blasting steps described above are necessary. Third, protrusions 8 on heat sink 5' cause turbulence in the flow of resin during the molding process, and possibly can cause the formation of undesirable voids in encapsulate 4. Fourth, because heat sink 5' is heavy, and is much thicker than inner leads 11', inner leads 11' may become bent during handling of the leadframe after heat sink 5' is attached thereto. Such a bend in the leads may cause short circuiting and may adversely affect wire bonding. Fifth, because lower surface 5c' of heat sink 5' is exposed, a more complicated mold is required than would be used for an ordinary leadframe that does not have an exposed heat sink. Finally, excess encapsulate flashes onto lower surface 5c' of heat sink 5' during molding. Accordingly, a deflash step is necessary to remove the excess molding compound. This deflash process typically includes a chemical deflash step, followed by a mechanical deflash step using a water jet rinse.

SUMMARY OF THE INVENTION

The present invention includes a semiconductor package that has excellent heat dissipation capabilities, but does not have the numerous manufacturing problems and costs associated with a conventional thick, exposed heat sink. The applicants have discovered that comparable heat dissipation characteristics and superior package molding may be obtained with a thinner, nonexposed heat sink, rather than a thick, exposed heat sink.

One embodiment of a semiconductor package within the present invention includes a semiconductor chip encapsulated within a 28 mm square molded package body. The semiconductor chip is mounted on a fully encapsulated, flat plate (i.e., the heat sink), which may be formed of copper or other materials. Metal leads, which are much thinner than the plate, extend from a first end overhanging the plate within the package body to a second end outside of the package body. The plate may be adhesively attached to the inner ends of the leads with an electrically insulative, thermally conductive adhesive tape, or staked to pseudo tie bars that extend from the corners of the package. The package may be used for high power applications that require excellent heat dissipation characteristics.

DESCRIPTION OF THE PREFERRED EMBODIMENTS

This application is related to an application entitled "Leadframe for Molded Semiconductor Package and Semiconductor Package Made Using the Leadframe," application Ser. No. 09/513,232, which was filed herewith on Feb. 24, 2000 and is incorporated herein by reference in its entirety. The present application claims priority from Korean patent application 99-13130, which was filed in the Korean Industrial Property Office on Apr. 14, 1999, was provided to the U.S. Patent and Trademark Office with the present application, and is incorporated herein by reference.

Figure 3:
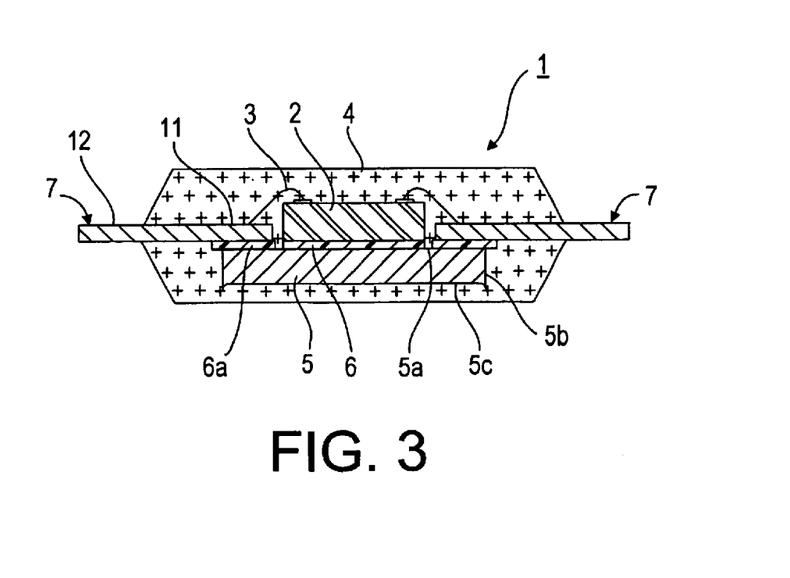
FIG. 3 is a cross-sectional side view of a semiconductor package 1 having a nonexposed heat sink 5.

FIG. 3 is a cross-sectional view of an embodiment of semiconductor package 1 within the present invention. Semiconductor package 1 may be fabricated using a variety of leadframes, two examples of which are discussed further below.

Package 1 of FIG. 3 includes a semiconductor chip 2 that is centrally mounted on a planar upper surface 5a of an encapsulated metal plate, denoted as heat sink 5. A thermally conductive adhesive 6, which may be a film or a paste, attaches chip 2 to upper surface 5a of heat sink 5. A plurality of metal leads 7 each extend from an encapsulated first end that is adjacent to chip 2 to a second end that is outside of the package body formed by encapsulate In particular, each lead 7 comprises an encapsulated inner lead 11 and an exposed outer lead 12. Inner leads 11 extend over and are attached to an outer peripheral portion of upper surface 5a of heat sink 5 by means of an electrically insulative, thermally conductive adhesive layer 6a comprised of, for example, a double-sided adhesive tape. A plurality of metal bond wires 3 each electrically connect an inner lead 11 to a bond pad of semiconductor chip 2. A resin encapsulate 4 forms a package body. Encapsulate 4 completely covers chip 2, bond wires 3, heat sink 5, and inner leads 11.

In semiconductor package 1 of FIG. 3, heat is transmitted from semiconductor chip 2 to heat sink 5 via thermally conductive adhesive 6. Heat from heat sink 5 is believed to primarily exit package 1 via conduction from heat sink 5 to the overhanging portions of inner leads 11, and 35 from there through leads 7 to a circuit board upon which the package is mounted.

Heat sink 5 may be formed of a variety of materials, such as copper, anodized aluminum, or ceramic (e.g., aluminum nitride). In view of experiments discussed below, a copper heat sink 5 for a 28 mm square high power package may have a thickness between upper surface 5a and lower surface 5c of 0.3 mm to 0.7 mm (e.g., about 0.5 mm). By contrast, copper leads 7 and conventional encapsulated die paddles (which are not heat sinks) typically have a thickness of about 0.12 mm to 0.15 mm. Thus, in this embodiment, heat sink 5 is two to 5.8 times thicker than leads 7.

Figure 4:
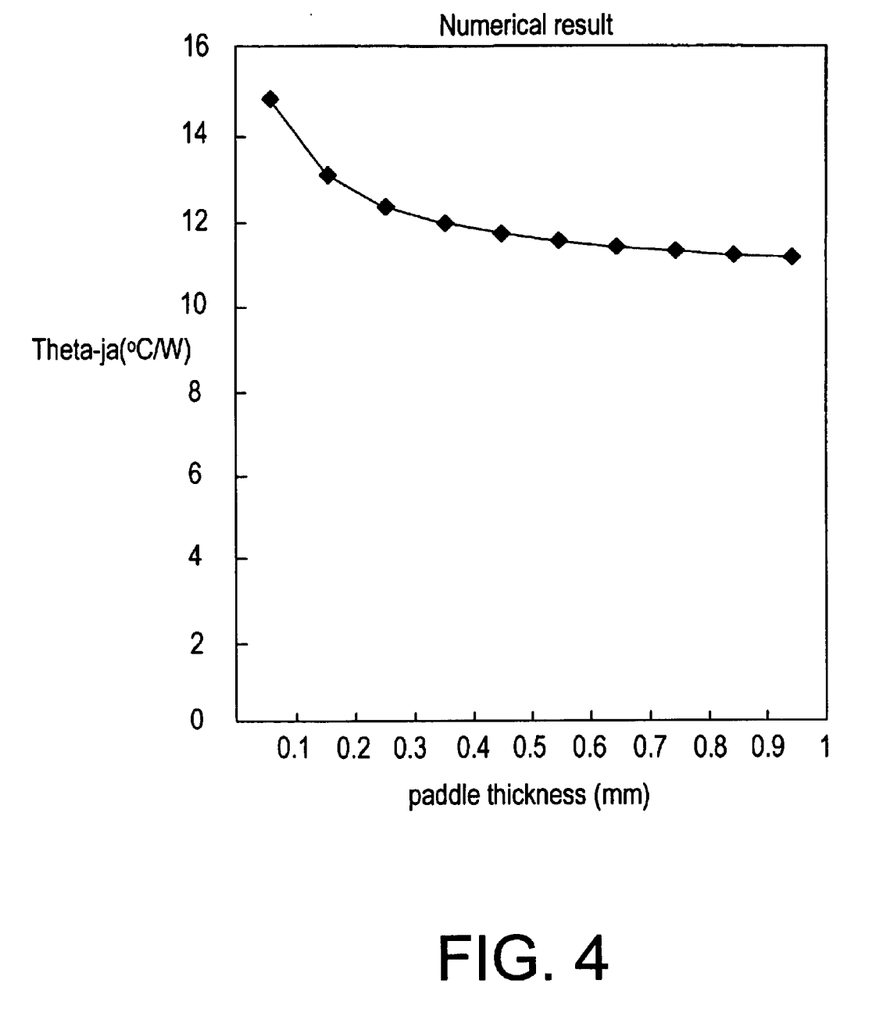
FIG. 4 is a graph depicting an example of the variation in heat discharge effect depending on the thickness of a fully encapsulated heat sink.

FIG. 4 is a graph depicting a variation in heat discharge effect depending on the thickness of a copper heat sink. In FIG. 4, the abscissa axis represents the thickness (mm) of a heat sink, and the ordinate axis represents the value of θJA (° C./W), which is indicative of thermal resistance. A lower value of θJA (° C./W) corresponds to superior heat discharge characteristics.

FIG. 4 describes the results of mathematical modeling conducted for a molded quad flat pack semiconductor package having a size of 28 mm×28 mm and 208 leads. In the model, the thickness of a fully encapsulated heat sink was varied from 0.1 mm to 1.0 mm. The model results were confirmed by experiment.

Referring to FIG. 4, it was found that there was a remarkable decrease in the value of θJA (° C./W) for heat sinks having a thickness ranging from 0.1 mm to 0.3 mm. It is also found that the rate of decrease in the value of θJA (° C./W) is low where heat sink thickness exceeds 0.3 mm. That is, there is little incremental reduction in the value of θJA (° C./W) for heat sinks having thicknesses greater than 0.3 mm.

Experiments in molding a 28 mm square package having a fully encapsulated heat sink showed that there is a tendency for voids to be formed at the central portion of the lower surface of the package body when the heat sink 5 has a thickness greater than 1.0 mm. It was also found that, when using a leadframe and a heat sink with a thickness of less than 0.2 mm, there is a tendency for voids to be formed at a portion of the lower surface of the package body extending from the air vent region opposite to the initial encapsulating resin vent region. It was also found that, when the heat sink has a thickness ranging from 0.30 mm to 0.70 mm, and in particular, a thickness of about 0.50 mm, voids do not occur (or rarely occur) during molding.

Accordingly, there is a point of diminishing returns in FIG. 4 where further increases in thickness of heat sink 5 of FIG. 3 have little effect on θJA (° C./W). The curve will have the same shape, albeit with different numerical levels, as the material of heat sink 5 is varied amongst materials having greater or lesser thermal conductivity (e.g., copper compared to diamond). The lower limit on the thickness of a fully encapsulated heat sink will largely be determined by the ability to mold without the formation of voids. The thermal performance also will be determined by the amount of overhang of inner leads 11 over upper surface 5a of heat sink 5 of FIG. 3, the size of the gap between upper surface 5a and inner leads 11, and the thermal conductivity of adhesive 6a (if any) and heat sink 5, among other possible factors.

Figure 5A:
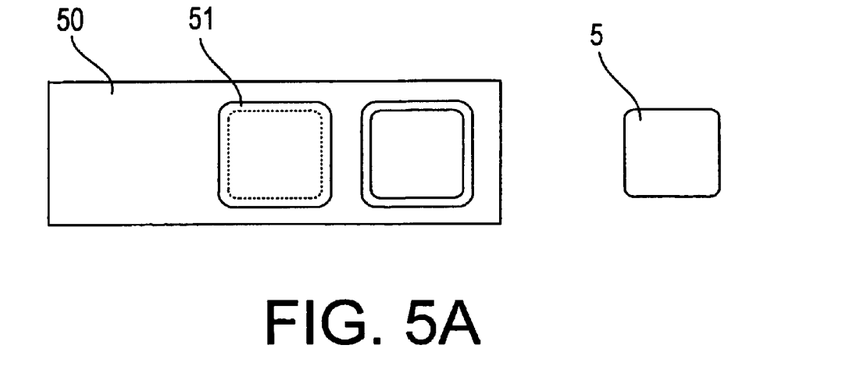
FIG. 5A is a plan view illustrating a procedure for fabricating a heat sink 5.
Figure 5B:
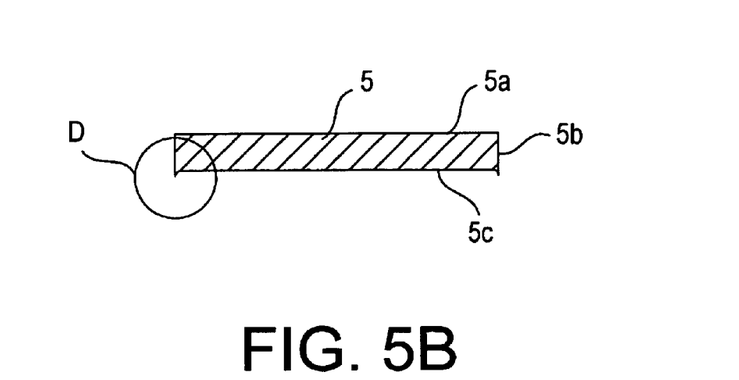
FIG. 5B is a cross-sectional side view of heat sink 5.
Figure 5C:
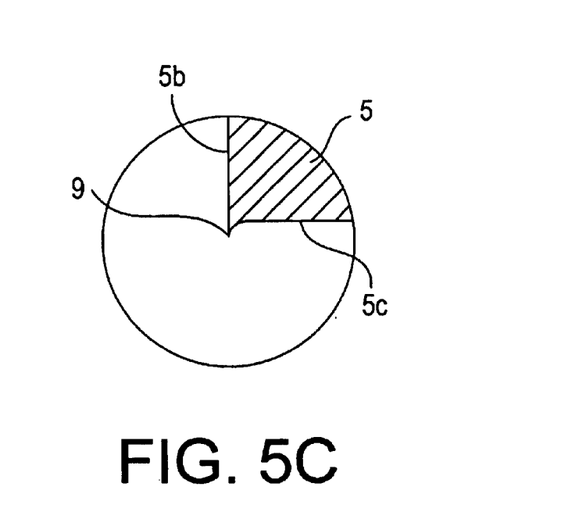
FIG. 5C is an enlarged cross-sectional side view of a portion D of FIG. 5B.

FIG. 5A is a schematic view illustrating a procedure for fabricating a heat sink 5 according to one embodiment of the present invention. FIG. 5B provides a side view of heat sink 5. FIG. 5C is an enlarged view of portion D of FIG. 5B.

As shown in FIGS. 5A to 5C, heat sink 5 is fabricated in a single stamping step by stamping a square loop slot 51 through a metal sheet 50 having a thickness of 0.3 to 0.7 mm, e.g., 0.5 mm. Heat sink 5 may be stamped in one step, as opposing to the two stamping steps required to form heat sink 5' of FIG. 1, because metal sheet 50 of FIG. 5A is significantly thinner than metal sheet 50' of FIG. 2 (0.3 to 0.7 mm verses 1.0 to 3.0 mm).

When heat sink 5 is downwardly punched from metal sheet 50, downward-extending burrs 9 (FIG. 5C) may be formed at the edge of lower surface 5c of heat sink 5. To avoid tears in adhesive layer 6a of package 1 of FIG. 3, upper surface 5a of heat sink 5 opposite burrs 9 should be attached to adhesive layer 6a.

The entire surface of heat sink 5 may be coated using the well-known black oxidation process to improve the attachment of heat sink 5 to the molded resin encapsulate 4. There is no need to perform the other nickel plating or sand blasting processes described above with respect to the prior art heat sink 5', since heat sink 5 is fully encapsulated.

Other advantages of the fully encapsulated heat sink 5 of the present invention are readily apparent. First, as discussed above, the thermal performance of heat sink 5 is comparable to a thicker, exposed heat sink. Second, heat sink 5 is significantly thinner than heat sink 5' of FIG. 1, which reduces material costs and weight, and reduces any bending of inner leads 11 due to the attachment of a heat sink thereto. Third, since heat sink 5 is fully encapsulated, there is no need for the costly deflash process described above.

Figure 10A:
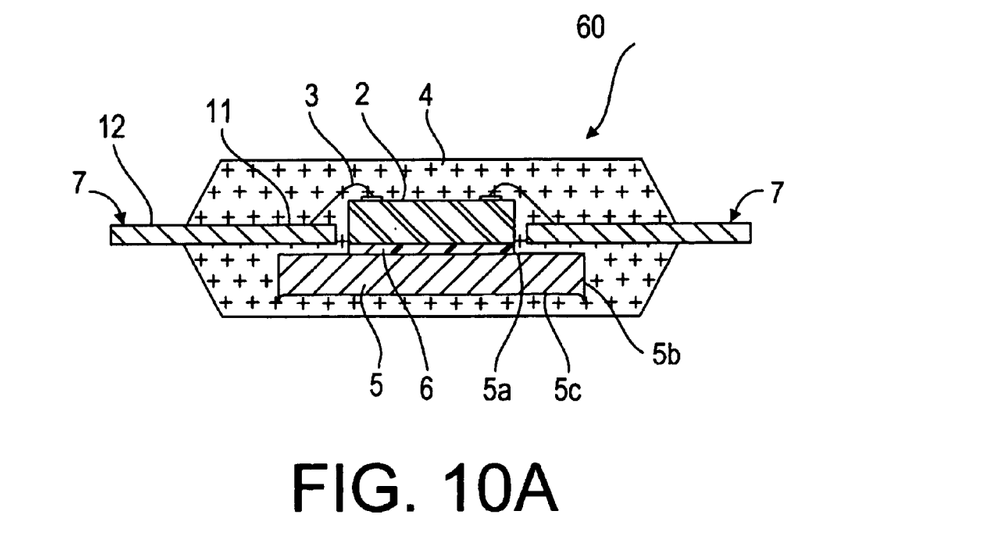
FIG. 10A is a cross-sectional side view of an alternative semiconductor package 60.
Figure 10B:
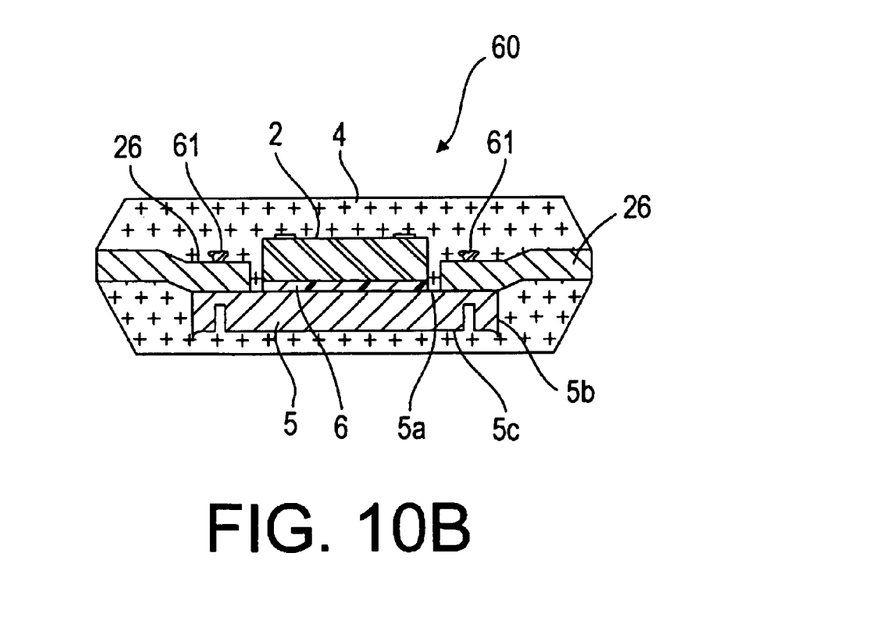
FIG. 10B is a second cross-sectional side view of semiconductor package 60 showing metal protrusions 61 of heat sink 5 joined to down set pseudo tie bars 26.

FIG. 10A is an alternative semiconductor package 60 within the present invention. Package 60 is the same as semiconductor package 1 of FIG. 3 except with respect to the fastening of heat sink 5 to the leadframe of the package. In package 60, adhesive layer 6a is omitted, and a small layer of encapsulate 4 is between heat sink 5 and the portion of inner leads 11 that overhangs heat sink 5. In package 60, heat sink 5 is supported in the central region of the package by encapsulated members that are separate from the leads. In particular, as shown in FIG. 10B, heat sink 5 is mechanically fastened to members that formerly were part of the leadframe used to make package 60. In this example, the members are four, down set, electrically isolated pseudo tie bars 26 that each extend diagonally from a corner of the package body towards chip 2. (Pseudo tie bars 26 are described in further detail below with respect to leadframe 20 of FIG. 6A.) A stake-like metal protrusion 61 extends from corner portions of upper surface 5a of heat sink 5 through a hole in each pseudo tie bar 26. Each protrusion 61 is stamped or swaged against the respective pseudo tie bar 26 so as to form a metal to metal connection. In package 60, heat transmitted from chip 2 to heat sink 5 is believed to primarily dissipate by conduction through encapsulate 4 to inner leads 11.

As mentioned above, the nonexposed heat sink 5 of the present invention may be used with a variety of leadframe configurations to make semiconductor package 1 of FIG. 3. Artisans should appreciate that the present invention is not limited to a particular style of leadframe, lead, or package.

As examples of the versatility of the present invention, two exemplary leadframes are described below that may be used to make semiconductor package 1 of FIG. 3. In particular, semiconductor package 1 may be made with leadframe 20 of FIGS. 6A and 6B, and with a new style of leadframe, leadframe 10 of FIGS. 7A–9B.

Figure 6A:
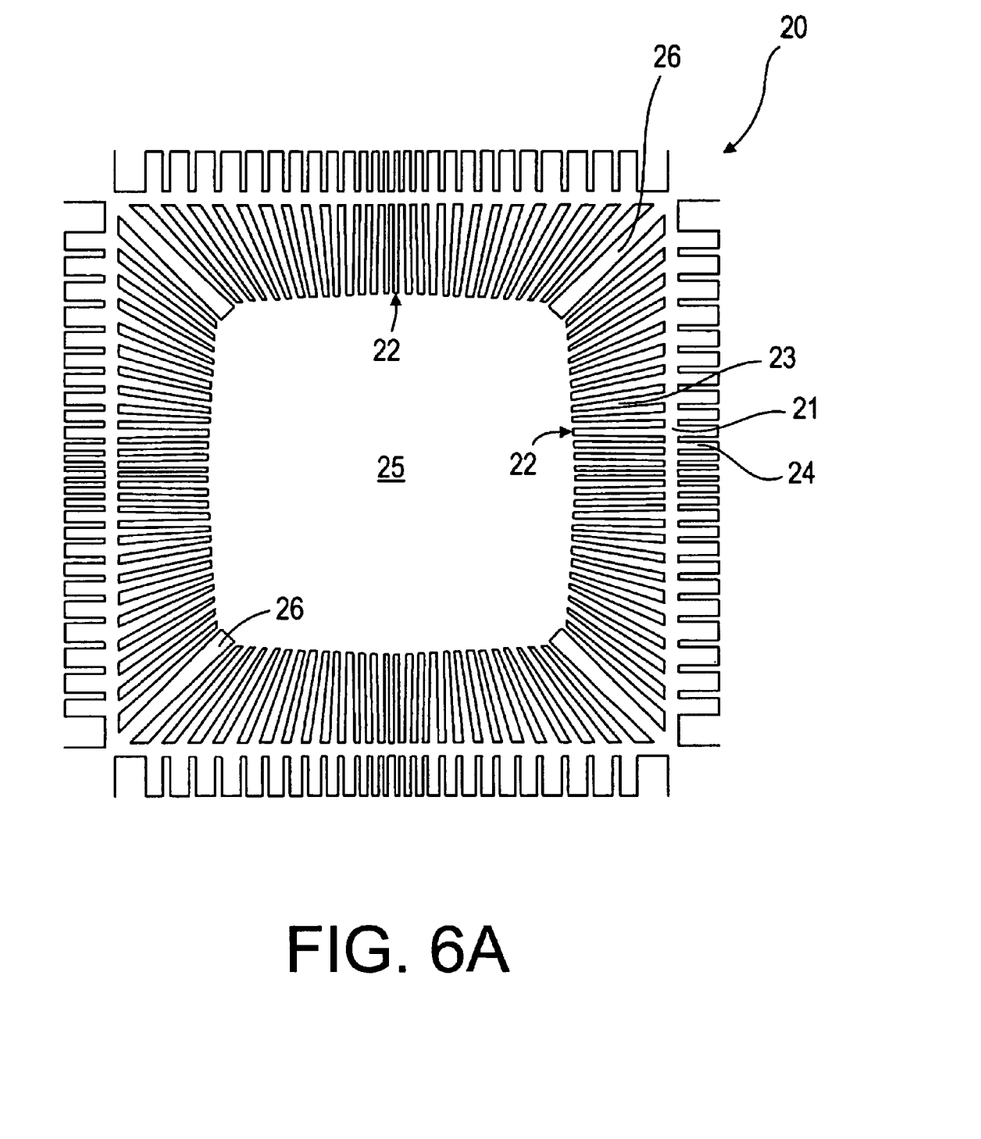
FIG. 6A is a plan view of a leadframe 20.

Referring to FIG. 6A, leadframe 20 is formed from; a thin metal sheet (e.g., 0.12 to 0.15 mm thick copper, copper alloy, Alloy 42, or some other conventional metal) by stamping or etching. Leadframe 20 includes an inner rectangular frame formed by rectilinear dam bars 21. A plurality of leads 22 extending from dam bars 21 include an inner lead 23 and an outer lead 24. Inner leads 23 are uniformly spaced from each other. Each inner lead 23 extends from a first end integral with an inner side of dam bar 21 to a second end adjacent to a central opening 25 of leadframe 20. Outer leads 24 each extend from a first end integral with an outer side of dam bar 21 to a second end (not shown) integral with an outer frame (not shown) of leadframe 20. Pseudo tie bars 26 are arranged at four corners of the leadframe 20, respectively. Each pseudo tie bar 26 extends diagonally from a corner of dam bar 21 toward central opening 25. As is apparent from the above description, leadframe 20 has a symmetrical structure in longitudinal, lateral, and diagonal directions.

Figure 6B:
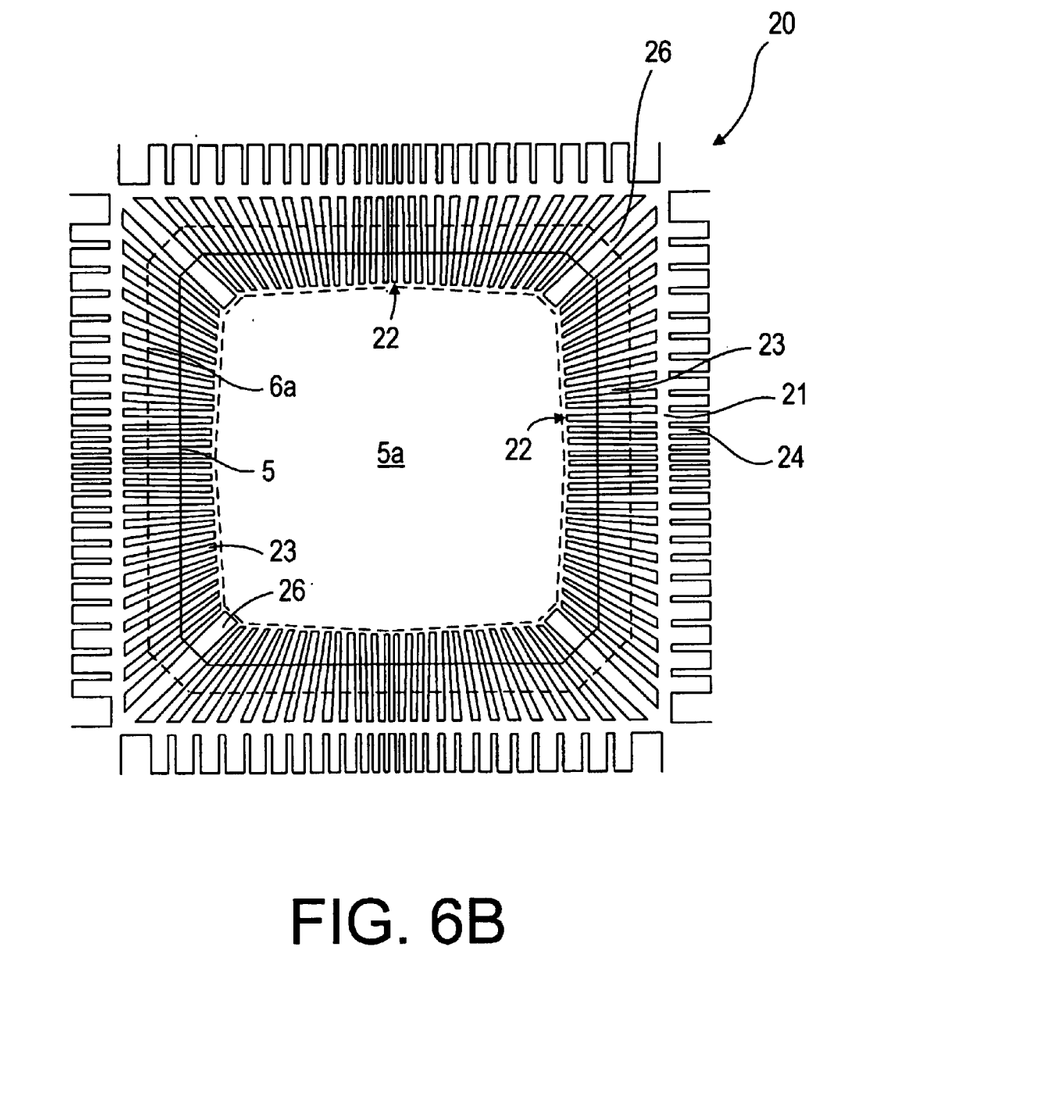
FIG. 6B is a plan view of leadframe 20 with an attached heat sink 5.

FIG. 6B shows a leadframe 20 within the present invention that includes a heat sink 5 (shown by solid lines). A peripheral portion of upper surface 5a of heat sink 5 is attached to the lower surface of inner leads 23 and pseudo tie bars 26 using a ring of an electrically insulative, thermally conductive adhesive layer 6a. Layer 6a is shown between dash lines in FIG. 6B. Layer 6a may be a double sided adhesive tape. The inner edge of layer 6a extends slightly into the central opening 25 just beyond the tips of inner leads 23. A method of applying the tape includes first applying the tape to a heated leadframe 20, attaching heat sink 5 to the opposite side of the tape, and then curing the tape in a curing oven at reduced pressure. An alternative embodiment uses segments of tape rather than a ring of tape. The segments of tape may be connected between heat sink 5 and pseudo tie bars 26.

As discussed above, a further alternative for connecting a metal heat sink 5 to pseudo tie bars 26 employs stake-like metal protrusions 61 that each extend from a corner peripheral portion of first surface 5a of heat sink 5, as shown in FIG. 10B. The protrusions 61 are formed by punching partially through corner areas of heat sink 5 from lower surface 5c. Each protrusion 61 fits through a hole in the respective pseudo tie bar 26. A metal to metal connection is formed by stamping or swaging the protrusions 61 onto pseudo tie bars 26.

An alternative heat sink 5 may be formed of a nonconductive material, such as ceramic. A technique for affixing a ceramic heat sink may include forming a hole in the upper surface 5a of the heat sink 5 near each of the four corners of heat sink 5. Pseudo tie bars 26 may be punched so as to form a downward-extending stake that can subsequently be stamped into the holes in the ceramic heat sink 5, thereby forming a connection that secures heat sink 5 to pseudo tie bars 26. Pseudo tie bars 26 would not need to be down set in such a configuration. Inner leads 23 could rest on the heat sink 5, since it would be nonconductive.

Figure 7A:
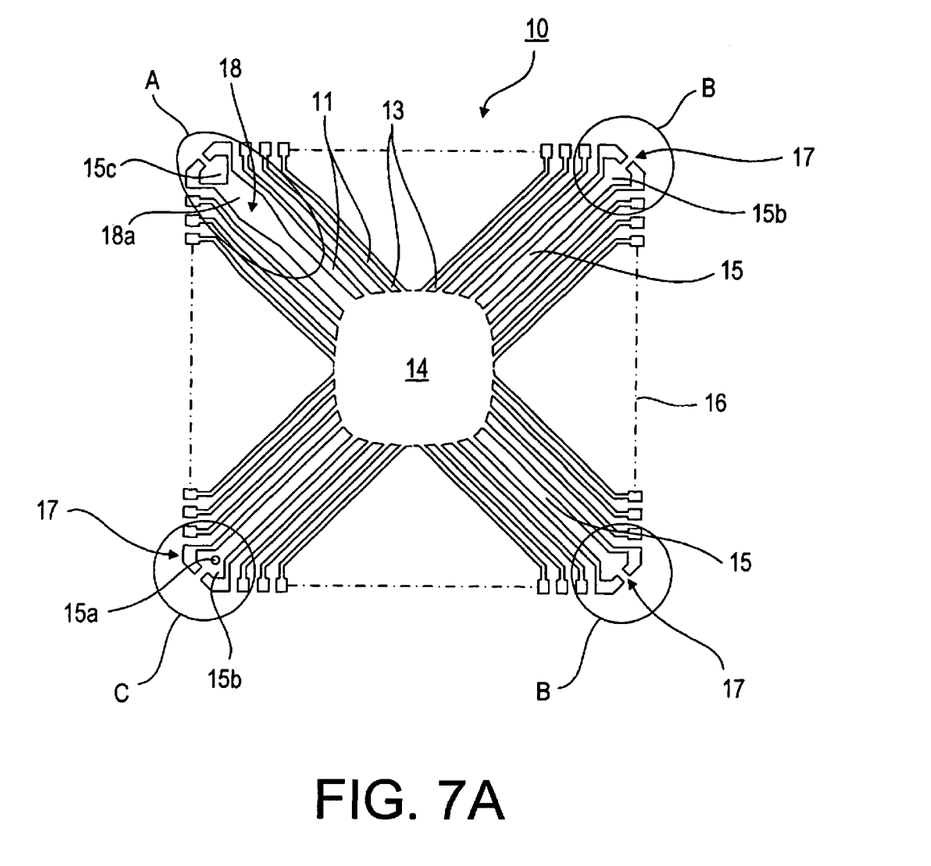
FIG. 7A is a plan view of a leadframe 10.
Figure 7B:
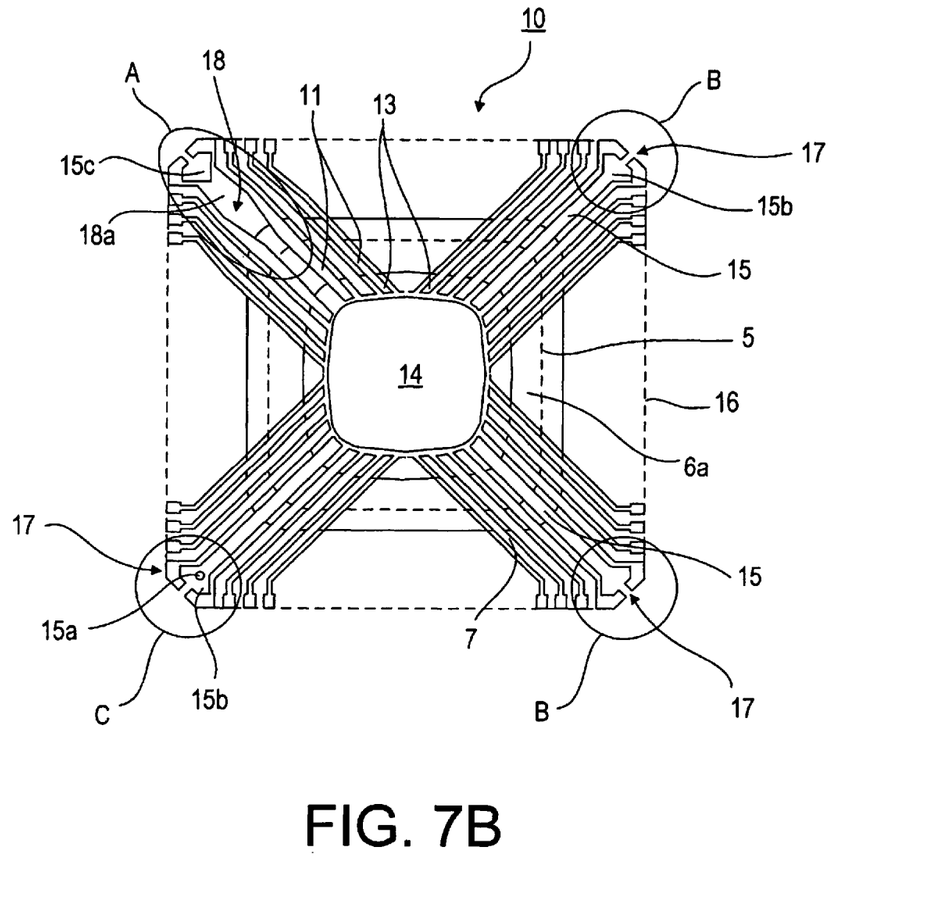
FIG. 7B is a plan view of leadframe 10 with an attached heat sink 5.

FIGS. 7A and 7B show an alternative metal lead frame 10 within the present invention Leadframe 10 includes features, discussed further below, that enable easier and superior molding of the package body, reduce lead bending, and facilitate wire bonding of the leads.

A plurality of metal leads (e.g., copper) extend radially around central opening 14. Each lead has an inner lead 11 that will be encapsulated and an outer lead (denoted by the reference numeral 12 in FIGS. 9A and 9B) that will extend outside of the package body. An outer end of inner lead 11 is integrally connected to the inner side of a dam bar 19 (see FIGS. 8, 9A, 9B) of leadframe 10. An opposite free end of each inner lead 11 is adjacent to central opening 14 (FIG. 7A). An inner end of outer lead 12 is integrally connected to an outer side of dam bar 19 (FIGS. 9A and 9B). An opposite outer end (not shown) of each outer lead 12 is connected to an outer frame (not shown) of leadframe 10.

An initial encapsulating introduction region 18 is present at one corner of the leadframe 10 where melted encapsulating resin is introduced into a mold cavity through a mold runner. Air vent regions 17 are present at the remaining three corners of the leadframe 10. Air vent regions 17 help to vent air from the mold cavity when the encapsulating resin is introduced. A portion of inner leads 11 near free ends 13 may be plated with silver to facilitate bond wire connections.

Leadframe 10 also includes three pseudo tie bars 15 beginning at the respective air vent regions 17. Pseudo tie bars 15 extend diagonally from dam bar 19 toward the central opening 14. No pseudo tie bar is arranged at the initial encapsulating resin introduction region 18. Instead, an encapsulating resin introduction slot 18a having a relatively large width is formed to facilitate introduction of the resin into the mold cavity.

FIG. 7B shows leadframe 10 with a heat sink 5 attached to inner leads 11 and pseudo tie bars 15 by means of a ring of an adhesive layer 6a. Adhesive layer 6a may be a double-sided adhesive tape. Adhesive layer 6a is attached to the lower surfaces of inner leads 11 and pseudo tie bars 15.

Figure 8:
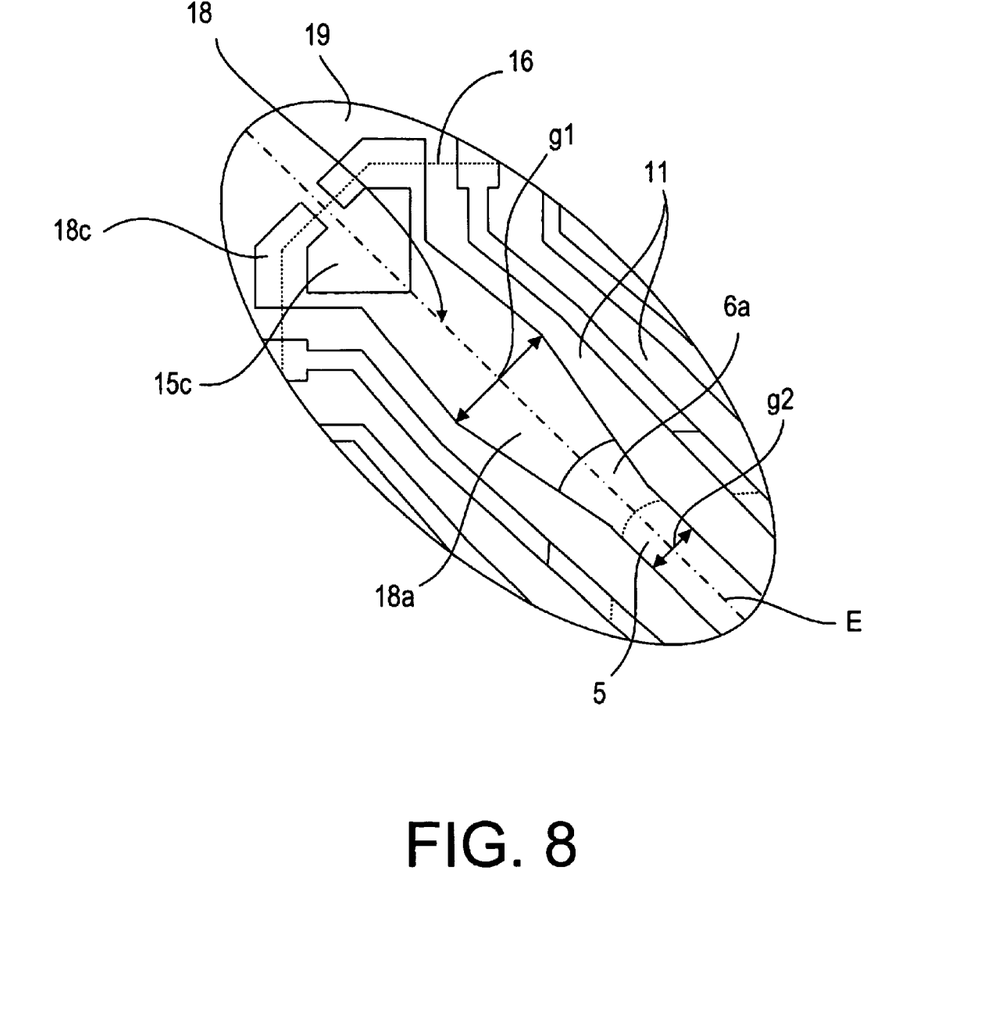
FIG. 8 is a plan view of a portion A of FIGS. 7A and 7B.
Figure 9A:
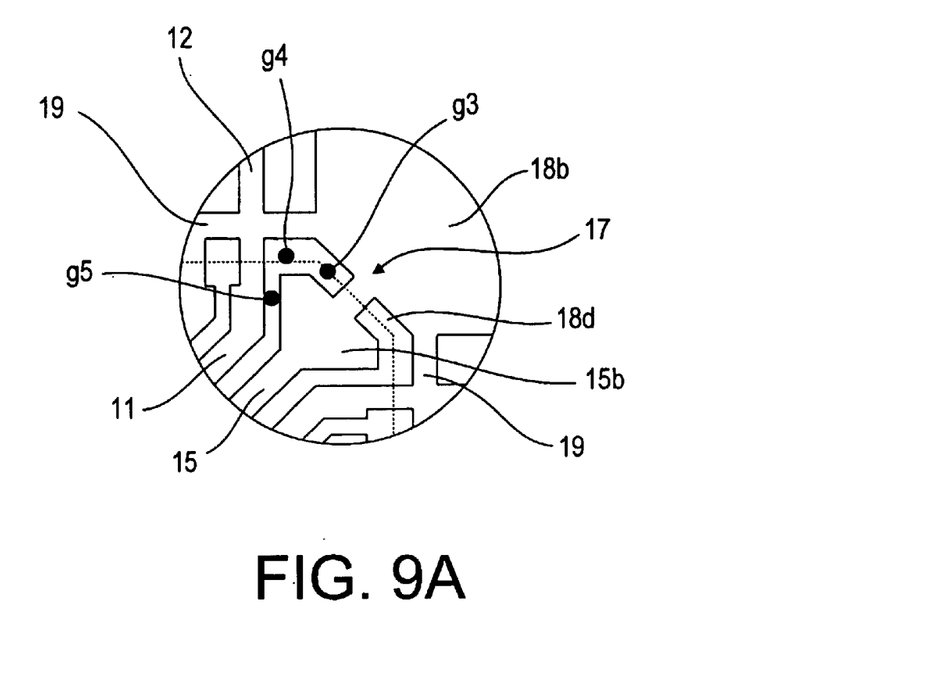
FIG. 9A is a plan view of a portion B of FIGS. 7A and 7B.
Figure 9B:
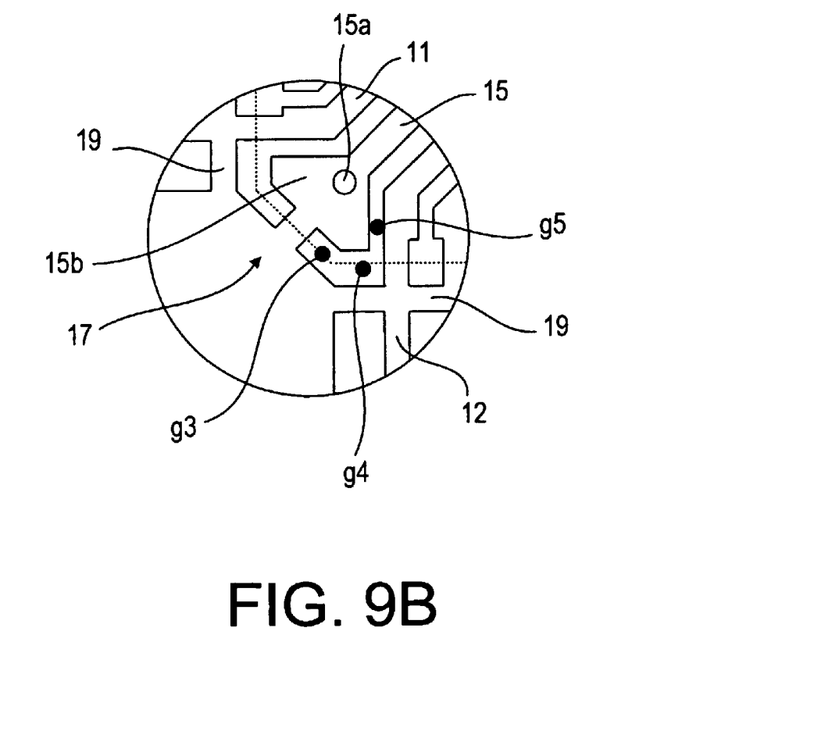
FIG. 9B is a plan view of a portion C of FIGS. 7A and 7B.

FIG. 8 is an enlarged plan view of portion "A" of FIGS. 7A and 7B. Slot 18a is between at least one pair of inner leads 11 respectively arranged on opposite sides of a phantom line E that extends diagonally from one corner of the encapsulated region (denoted by dash lines 16) toward central opening 14 (see FIGS. 7A and 7B). Slot 18a has a relatively wide portion outward of where adhesive layer 6a and heat sink 5 attach to inner leads 11, which allows resin to be introduced into the mold cavity through slot 18a without forming a turbulent or vortex flow. Slot ~a also has a relatively narrow portion inward of where adhesive layer 6a and heat sink 5 attach to inner leads 11. The wide portion of slot ~a has a width g1, and the narrower portion of slot 18a has a width g2. Preferably, the width g1 is not more than 0.7 mm, and the width g2 is not more than 0.35 mm (while still being greater than the width of the space defined between adjacent inner leads 11).

Leadframe 10 also is provided with an enlarged spade-shaped portion 15c at the outer end of slot 18a (FIG. 8). Enlarged spade-shaped portion 15c of leadframe 10 smoothly guides the melted encapsulating resin toward slot 18a. A slot 18c extending around the side portions and/or rear portion of enlarged spade-shaped portion 15c facilitates the downward flow of the melted encapsulating resin.

The inner leads 11 arranged at initial encapsulating resin introduction region 18 (or alternatively, all of the inner leads 11) have a gradually increasing width as they extend from dam bar 19.(FIGS. 8, 9A, and 9B) toward the central opening 14 (FIG. 7A). Accordingly, the space between adjacent inner leads 11 gradually reduces in width between dam bar 19 and central opening 14. The increased width of inner leads 11 adjacent to central opening 14 allows easy bond wire attachment, and provides strength that reduces the possibility of bending of inner leads 11 during the handling and molding of leadframe 10. The space defined between the inner ends of adjacent inner leads 11 is preferably not more than 0.35 mm to avoid melting of adhesive layer 6a and forming voids during the molding process.

FIGS. 9A and 9B provide enlarged plan views of portions "B" and "C", respectively, of FIGS. 7A and 7B, which include air vent regions 17. At each air vent region 17, one pseudo tie bar 15 and at least one pair of inner leads 11 adjacent to the pseudo tie bar 15 are arranged and extend from a corresponding corner of the leadframe 10 toward central opening 14. Pseudo tie bars 15 have a width corresponding to one or two times the width of an inner lead 11.

The outer end of each pseudo tie bar 15 (i.e., adjacent dam bar 19) has a spade-shaped enlarged portion 15b, that is integrally connected to dam bar 19. Enlarged portion 15b serves as an air vent member that allows air to be smoothly vented from the mold cavity during molding. A slot 18d extends around the side portions and/or rear portion of enlarged portion 15b. The air is smoothly vented from micro-ports at the three corners of the mold cavity through slots 18d, which prevents the formation of voids at those corners of the molded package body. With respect to the various portions of slot 18d of FIGS. 9A and 9B, slot 18d may have a width g3 of at least 0.2 mm, a width g5 of at least 0.15 mm, and a width g4 of at least 0.2 mm.

Enlarged portion 15b of FIG. 9B differs from enlarged portion 15b of FIG. 9A in that at least one information identification hole 15a is centrally formed through the respective enlarged portion 15b. Information identification hole 15a is used for leadframe alignment and identification purposes, and after molding becomes filled with encapsulate 4 (FIG. 3).

As apparent from the above description, leadframe 10 exhibits a superior resin filling profile, thereby avoiding formation of voids in a molding process.

Although several embodiments of the present invention have been disclosed for illustrative purposes, those skilled in the art will appreciate that various modifications, additions and substitutions are possible, without departing from the scope and spirit of the invention, which is defined by the accompanying claims.

We claim:

1. A semiconductor package comprising:
   a semiconductor chip;
   a package body formed of a hardened encapsulant material;
   a plurality of metal leads, wherein each lead is electrically connected to the chip;
   a flat metal plate fully encapsulated within said package body, wherein the chip is mounted on the plate and an encapsulated first portion of each of the leads overhangs a periphery of the plate; and
   a plurality of electrically isolated, encapsulated members, wherein one said member extends diagonally from a first corner, a second corner, and a third corner, respectively, of a perimeter of the package body toward the plate, overhangs the periphery of the plate, and is in a connection with the plate.

2. The package of claim 1, wherein the plate is comprised of copper and has a CuO or $Cu_2O$ film on all surfaces thereof.

3. The package of claim 1, wherein an electrically insulative, thermally conductive adhesive layer is attached between the first portion of the leads and the plate, and said layer is covered by said encapsulant material.

4. The package of claim 1, wherein the metal plate is connected to said members by an electrically insulative, thermally conductive adhesive layer.

5. The package of claim 1, wherein the metal plate has a thickness that is at least two times a thickness of said leads.

6. The package of claim 1, wherein the encapsulant material is between said plate and the first portion of the leads.

7. The package of claim 1, wherein at least a plurality of the leads increase in width as those leads extend from the perimeter of the package body toward the plate.

8. The package of claim 7, wherein two leads of increasing width are adjacent and extend from opposite sides of a fourth corner of the perimeter of the package body, said two leads defining a first slot between them, said first slot extending from the first ends of the two leads to their respective second ends and filled with the encapsulant material.

9. The package of claim 8, further comprising a short tapered metal first member located at the fourth corner of the perimeter of the package body and extending into the first slot for only a portion of a length of the first slot.

10. The package of claim 1, wherein an electrically insulative, thermally conductive adhesive layer is attached between the first portion of the leads and the plate, and between the members and the plate, and is covered by the encapsulant material.

11. The package of claim 1, wherein two leads are adjacent and extend from opposite sides of a fourth corner of the perimeter of the package body, said two leads defining a first slot between them, said first slot extending from the first ends of the two leads to their respective second ends and filled with the encapsulant material, and further comprising a short tapered metal first member located at the fourth corner of the perimeter of the package body and extending into the first slot for only a portion of a length of the first slot.

12. A leadframe comprising:

a metal frame including a central region within the frame;

a plurality of metal leads extending from a first end integral with the frame to a second end adjacent to the central region, wherein at least a plurality of the leads gradually increase in width as those leads extend from the frame toward the central region; and a flat metal plate supported in the central region, wherein a first portion of each said lead overhangs a periphery of said plate.

13. The leadframe of claim 12, wherein the plate is comprised of copper and has a CuO or $Cu_2O$ film on all surfaces thereof.

14. The leadframe of claim 13, wherein an electrically insulative, thermally conductive adhesive layer is attached between the first portion of the leads and the plate.

15. The leadframe of claim 12, further comprising a plurality of members extending from said frame adjacent to said leads, wherein each said member overhangs the periphery of the plate and is in a connection with said plate.

16. The leadframe of claim 15, wherein each said member extends from a corner of said frame.

17. The leadframe of claim 15, wherein the metal plate is connected to said members by an electrically insulative, thermally conductive adhesive layer.

18. The leadframe of claim 15, wherein each connection is a metal to metal connection between the plate and the respective member.

19. The leadframe of claim 18, wherein each said metal to metal connection is between the respective member and a protrusion from a surface of the plate, and the protrusion is stamped or swaged against the respective member to form the metal to metal connection.

20. The leadframe of claim 15, wherein the metal plate has a thickness that is at least two times a thickness of said leads.

21. The leadframe of claim 12, wherein two leads of increasing width are adjacent and extend from opposite sides of a first corner of the frame, said two leads defining an open first slot between them, said first slot extending from the first ends of the two leads to their respective second ends.

22. The leadframe of claim 21, further comprising a short tapered metal first member integral with the first corner of the frame and extending into the first slot for only a portion of a length of the first slot.

23. The leadframe of claim 12, further comprising three metal pseudo tie bars each extending diagonally from a first end integral with a first corner, a second corner, and a third corner, respectively, of the frame to a second end overhanging the periphery of the plate.

24. The leadframe of claim 23, wherein each pseudo tie bar includes a first portion at the second end overhanging the periphery of the plate, a second portion adjacent to the first end integral with the respective corner of the frame, and a third portion between the second portion and the first portion, wherein the second portion is wider than the third portion and has edges that taper into the third portion.

25. A semiconductor package comprising:

a semiconductor chip;

a package body formed of a hardened encapsulant material;

a plurality of metal leads, wherein each lead is electrically connected to the chip;

a flat metal plate fully encapsulated within said package body, wherein the chip is mounted on the plate, and an encapsulated first portion of each of the leads overhangs the periphery of the plate, and the plate has a thickness that is at least two times a thickness of the leads; and a plurality of encapsulated members, wherein each said member extends from a perimeter of the package body toward the plate, and overhangs a periphery of the plate, and is in a metal to metal connection with a surface of the plate.

26. The package of claim 25 wherein an electrically insulative, thermally conductive adhesive layer is attached between the first portion of the leads and the plate, and the adhesive layer is covered by the encapsulant material.

27. The package of claim 25, wherein the encapsulant material is between said plate and the first portion of the leads.

28. The package of claim 25, wherein a protrusion of the flat metal plate is stamped or swaged against the respective member, thereby forming the metal to metal connection.

29. The package of claim 25, wherein at least a plurality of the leads increase in width as those leads extend from the perimeter of the package body toward the plate.

30. A semiconductor package comprising:

a semiconductor chip;

a package body formed of a hardened encapsulant material;

a plurality of metal leads each electrically connected to the chip, wherein at least a plurality of the leads increase in width as those leads extend from a perimeter of the package body, and wherein two leads of increasing width are adjacent and extend from opposite sides of a first corner of the perimeter of the package body, said two leads defining a first slot between them, said first slot extending from the first ends of the two leads to their respective second ends;

a flat metal plate fully encapsulated within said package body, wherein the chip is mounted on the plate, and an encapsulated first portion of each of the leads overhangs a periphery of the plate, and the plate has a thickness that is at least two times a thickness of the leads;

a metal first member located at a first corner of the package body and extending into the first slot for only a portion of a length of the first slot, the first member being encapsulated by the package body and including intersecting straight edges that taper to a point aligned with a central axis of the first slot; and three metal pseudo tie bars each extending diagonally from a first end located at a second corner, a third corner, and a fourth corner, respectively, of the perimeter of package body to a second end overhanging the periphery of the plate and each being in a connection with the plate.

31. The package of claim 30, wherein each pseudo tie bar includes a first portion at the second end overhanging the periphery of the plate, a second portion adjacent to the first end located at the respective corner of the perimeter of the package body, and a third portion between the second portion and the first portion, wherein the second portion is wider than the third portion and has edges that taper into the third portion.

32. A leadframe comprising:

a metal frame including four corners and a central region within the frame;

three metal pseudo tie bars each extending diagonally from a first end integral with a second corner, a third corner, and a fourth corner, respectively, of the frame to a second end adjacent to the central region;

a plurality of metal leads each extending from a first end integral with the frame to a second end adjacent to the central region, wherein at least a plurality of the leads increase in width as those leads extend from the frame toward the central region, and wherein two leads of increasing width are adjacent and extend from opposite sides of a first corner of the frame, said two leads defining an open first slot between them, said first slot extending from the first ends of the two leads to their respective second ends; and a flat metal plate supported in the central region, wherein the plate has a thickness that is at least two times a thickness of said leads, and wherein a first portion of each said lead overhangs a periphery of the plate, and wherein a first portion of each said pseudo tie bars overhangs the periphery of the plate and is in a connection with the plate.

33. The leadframe of claim 32, wherein an electrically insulative, thermally conductive adhesive layer is attached between the first portion of the leads and the plate.

34. The leadframe of claim 32, wherein each of the connections between the plate and the first portions of the tie bars comprises an electrically insulative, thermally conductive adhesive layer.

35. The leadframe of claim 32, wherein each of the connections between the plate and the first portions of the tie bars comprises a metal to metal connection.

36. The leadframe of claim 32, wherein said first slot is between two pair of adjacent leads of increasing width, wherein each said pair includes one of the two leads defining the first slot, and wherein the two adjacent leads of each said pair define an open second slot between them, and each of the second slots has a width, and the width of the second slots each are less than the width of the first slot.

37. The leadframe of claim 32, wherein the first slot increases in width and then decreases in width from the frame toward the central region.

38. The leadframe of claim 32, further comprising a short tapered metal first member integral with the first corner of the frame and extending into the first slot for only a portion of a length of the first slot.

\* \* \* \* \*